(12) United States Patent
Oshima et al.

(10) Patent No.: US 11,461,857 B2
(45) Date of Patent: Oct. 4, 2022

(54) MANAGEMENT DEVICE AND METHOD

(71) Applicant: HONDA MOTOR CO., LTD., Tokyo (JP)

(72) Inventors: Ryo Oshima, Wako (JP); Nobuyuki Sasaki, Wako (JP); Mitsuhiro Ito, Wako (JP); Mio Oshima, Wako (JP); Yoshihiro Matsunaga, Wako (JP); Sho Takada, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 17/008,112

(22) Filed: Aug. 31, 2020

(65) Prior Publication Data
US 2020/0393515 A1 Dec. 17, 2020

Related U.S. Application Data

(63) Continuation of application No. PCT/JP2018/044021, filed on Nov. 29, 2018.

(30) Foreign Application Priority Data

Mar. 20, 2018 (JP) .............................. JP2018-053087

(51) Int. Cl.
*G06Q 50/06* (2012.01)
*G01R 31/367* (2019.01)
(Continued)

(52) U.S. Cl.
CPC .......... *G06Q 50/06* (2013.01); *G01R 31/367* (2019.01); *G01R 31/3648* (2013.01);
(Continued)

(58) Field of Classification Search
CPC .. G01R 31/3648; G01R 31/367; G01R 31/42; G01R 19/2513; G01R 31/36;
(Continued)

(56) References Cited

U.S. PATENT DOCUMENTS

2012/0173177 A1* 7/2012 Nishiyama ........ H02J 13/00006
702/62
2012/0228933 A1 9/2012 Shiokawa
(Continued)

FOREIGN PATENT DOCUMENTS

JP 2003333768 A 11/2003
JP 2010110101 A 5/2010
(Continued)

OTHER PUBLICATIONS

International Search Report for PCT/JP2018/044021 dated Jan. 8, 2019.
IPRP for PCT/JP2018/044021 dated Jan. 8, 2019.

*Primary Examiner* — Tarun Sinha
*Assistant Examiner* — Yossef Korang-Beheshti
(74) *Attorney, Agent, or Firm* — Thomas | Horstemeyer, LLP

(57) ABSTRACT

A management device is connected to an AC power line provided with a plurality of connection ports, each of which can be connected to an electric device including a power storage unit. The management device includes a measurement unit configured to measure an electric signal on the AC power line, a determination unit configured to determine a type of the electric device connected to the AC power line via a connection port in the plurality of connection ports based on a measurement result of the measurement unit, and a first prediction unit configured to predict an amount of power supply on the AC power line due to discharge of the power storage unit based on a determination result of the determination unit.

11 Claims, 8 Drawing Sheets

(51) Int. Cl.
　　*G01R 31/36*　　(2020.01)
　　*H02J 3/32*　　(2006.01)
　　*H02J 3/38*　　(2006.01)
　　*H02J 13/00*　　(2006.01)
　　*G01R 31/42*　　(2006.01)
　　*H02J 3/46*　　(2006.01)
　　*H02J 7/00*　　(2006.01)
　　*H02J 3/00*　　(2006.01)

(52) U.S. Cl.
　　CPC .............. *G01R 31/42* (2013.01); *H02J 3/32* (2013.01); *H02J 3/322* (2020.01); *H02J 3/38* (2013.01); *H02J 3/472* (2020.01); *H02J 7/0013* (2013.01); *H02J 7/00034* (2020.01); *H02J 7/00045* (2020.01); *H02J 7/0071* (2020.01); *H02J 13/00004* (2020.01); *H02J 13/00022* (2020.01); *H02J 3/003* (2020.01); *H02J 3/004* (2020.01); *H02J 13/00028* (2020.01); *H02J 2310/48* (2020.01)

(58) Field of Classification Search
　　CPC .......... H02J 13/00022; H02J 3/32; H02J 3/38; H02J 13/00028; H02J 3/00004; H02J 2310/48; H02J 2310/70; H02J 7/0013; H02J 7/00034; H02J 7/0071; H02J 3/322; H02J 3/472; H02J 3/003; H02J 3/004; G06Q 50/06; Y04S 40/126; Y02E 60/00
　　See application file for complete search history.

(56) References Cited

U.S. PATENT DOCUMENTS

| | | | | |
|---|---|---|---|---|
| 2013/0020993 | A1* | 1/2013 | Taddeo | H02J 7/00045 320/109 |
| 2014/0062397 | A1* | 3/2014 | Dyer | B60L 3/0023 320/109 |
| 2014/0117933 | A1* | 5/2014 | Nyu | H02J 3/322 320/109 |
| 2015/0244591 | A1* | 8/2015 | Brown | H04L 12/12 709/223 |
| 2017/0005515 | A1* | 1/2017 | Sanders | H02J 3/32 |

FOREIGN PATENT DOCUMENTS

| | | |
|---|---|---|
| JP | 2011083058 A | 4/2011 |
| JP | 2016163443 A | 9/2016 |
| WO | 2011039604 A1 | 4/2011 |
| WO | 2012008104 A1 | 1/2012 |
| WO | 2019181076 A1 | 9/2019 |

* cited by examiner

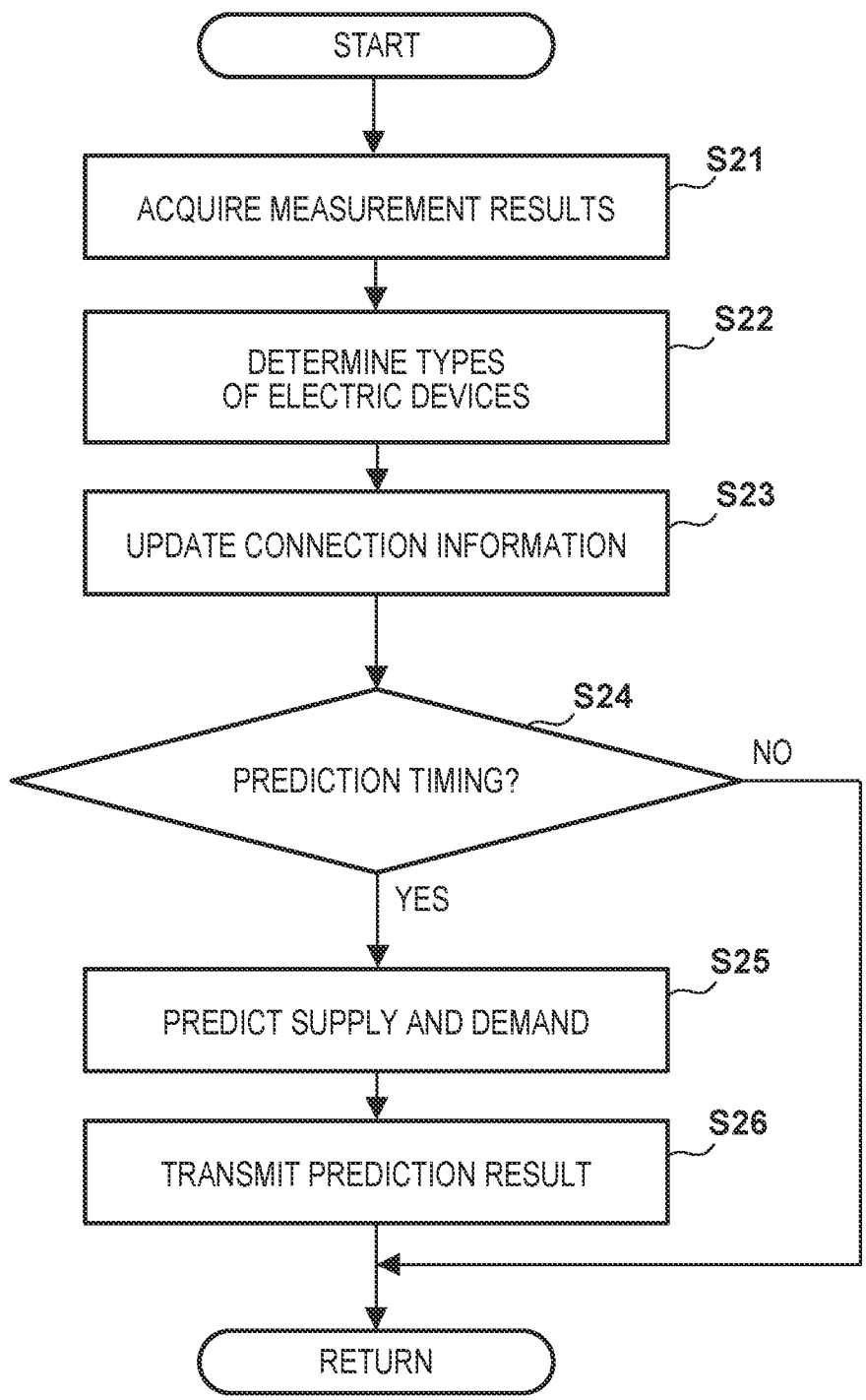

MANAGEMENT DEVICE AND METHOD

CROSS-REFERENCE TO RELATED APPLICATION(S)

This application is a Continuation of International Patent Application No. PCT/JP2018/044021, filed Nov. 29, 2018, which claims priority to and the benefit of Japanese Patent Application No. 2018-053087, filed Mar. 20, 2018, the entire disclosures of which are incorporated herein by reference.

BACKGROUND OF THE INVENTION

Field of the Invention

The present invention relates to a power environment management technique.

Description of the Related Art

Due to liberalization of electricity, various power management systems in which buying and selling of electricity is taken into consideration have been proposed. Japanese Patent Laid-Open No. 2011-083058 discloses a power supply system for a house, and in particular, a system for managing an amount of power stored in a storage battery and a type of its supply source.

Power devices of electric vehicles, such as electric automobiles and electric motorcycles, and transportable power supply devices, such as portable generators and portable batteries, can function as energy resources that form a VPP (Virtual Power Plant). Since such power devices are mobile, they can function as energy resources at unspecified places, while connection situations to AC power lines constantly change. Therefore, if it were possible to monitor what kinds of power devices are connected to an AC power line, it could be used to identify supply-demand relationship between the power devices and predict supply and demand for power, and convenience of operation of power would be improved.

SUMMARY OF THE INVENTION

An object of the present invention is to provide a technique capable of monitoring what kind of electric device is connected to an AC power line.

According to an aspect of the present invention, there is provided a management device connected to an AC power line provided with a plurality of connection ports, each of which can be connected to an electric device including a power storage unit, the management device comprising: a measurement unit configured to measure an electric signal on the AC power line; a determination unit configured to determine a type of the electric device connected to the AC power line via a connection port in the plurality of connection ports based on a measurement result of the measurement unit; and a first prediction unit configured to predict an amount of power supply on the AC power line due to discharge of the power storage unit based on a determination result of the determination unit.

Further features of the present invention will become apparent from the following description of exemplary embodiments (with reference to the attached drawings).

BRIEF DESCRIPTION OF THE DRAWINGS

FIG. 8 is a flowchart showing a process example of a management device in the embodiment of FIG. 7.

DESCRIPTION OF THE EMBODIMENTS

Figure 1:
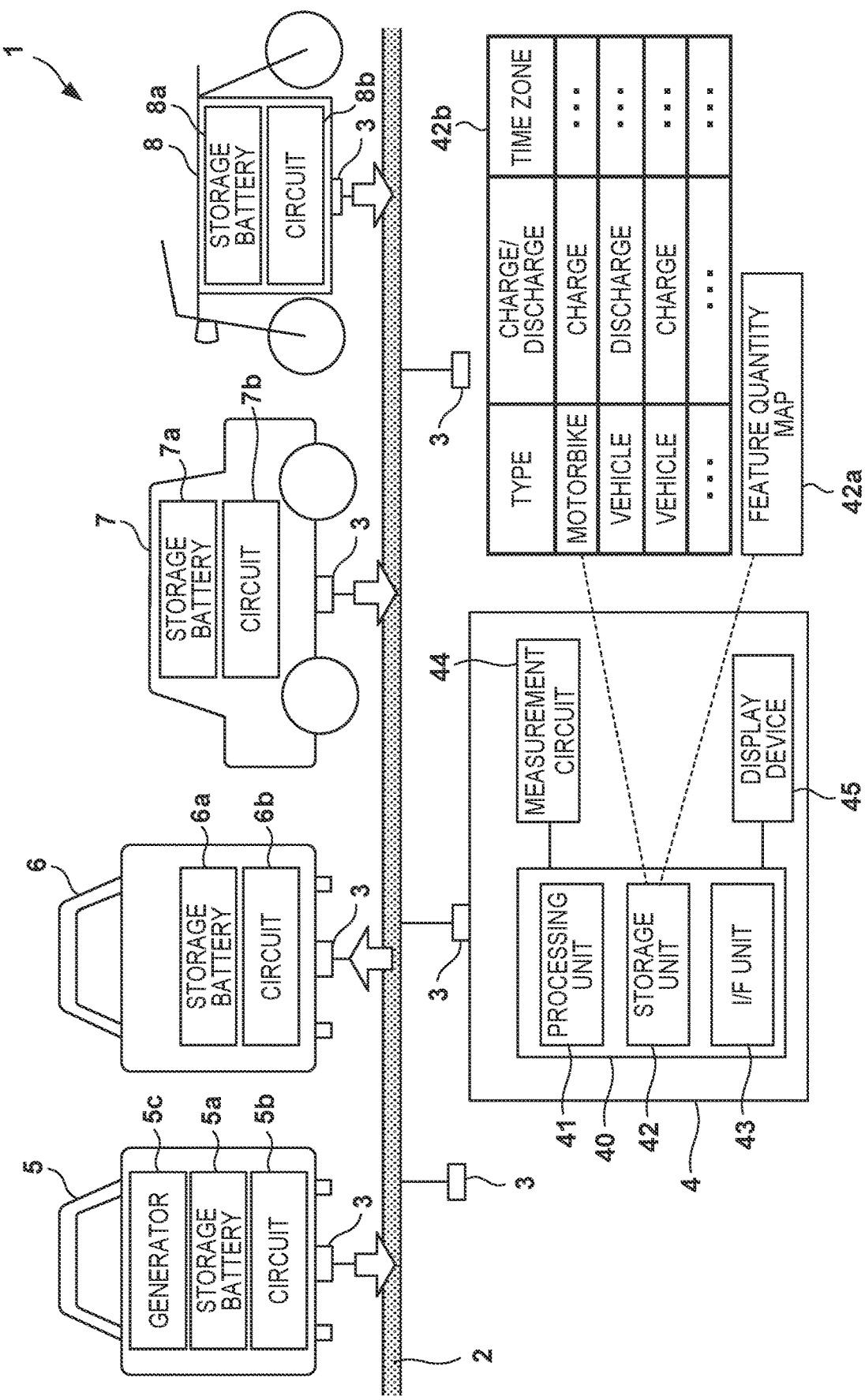
FIG. 1 is a schematic diagram of a management system.

Hereinafter, embodiments will be described in detail with reference to the attached drawings. Note that the following embodiments are not intended to limit the scope of the claimed invention, and limitation is not made an invention that requires all combinations of features described in the embodiments. Two or more of the multiple features described in the embodiments may be combined as appropriate. Furthermore, the same reference numerals are given to the same or similar configurations, and redundant description thereof is omitted.

First Embodiment

<System Configuration>
FIG. 1 is a schematic diagram of a management system 1. The management system 1 is a system in which a management device 4 monitors electric devices 5-8 connected to an AC power line 2. The AC power line 2 is connected to a power system and transmits AC power. The AC power line 2 can form, for example, a power network closed in a relatively small area. The relatively small area is, for example, a unit of a municipality, a park, public facilities, and one section of an apartment house. An aggregator may manage transmission and reception of power between sections. A circuit for connecting and disconnecting the closed AC power line 2 to/from the power system may be interposed between them.

The AC power line 2 is provided with a plurality of connection ports 3 to which the electric devices 5-8 can be detachably connected. The connection ports 3 include at least cables and connectors that electrically connect the electric devices 5-8 and the AC power line 2. In this embodiment, the connection ports 3 mainly make electrical connection between the electric devices 5-8 and the AC power line 2, and have a relatively simple configuration in which the connection ports 3 include no charge/discharge circuit. However, the connection ports 3 can be provided with protection circuits that prevent the electric devices 5-8 from being overcharged or overdischarged.

The electric devices 5-8 are illustrated as an example of electric devices connectable to the connection ports 3. Types and the number of electric devices connectable to the connection ports 3 are not limited to those. Electric devices 5 and 6 are both transportable power supply devices and devices that supply power to various electric loads connected to the electric devices 5 and 6. Examples of the electric loads can include a hot plate, a kettle, a microwave oven, a grill, a mixer, an air conditioner, a television, a lighting fixture, a dryer electric tool, a large lighting device, and a compressor.

The electric device 5 is a portable generator including a generator 5c, and the electric device 6 is a portable battery including no generator. The generator 5c is, for example, an engine generator that generates electric power by driving force of a gasoline engine. The electric device 5 includes a storage battery 5a, and the electric device 6 includes a storage battery 6a. The storage batteries 5a and 6a are secondary batteries such as lithium-ion batteries. The electric device 5 can store electric power generated by the generator 5c in the storage battery 5a. Even after the generator 5c runs out of fuel, the electric device 5 can supply the electric power stored in the storage battery 5a to the electric loads.

The electric device 5 includes a circuit 5b, and the electric device 6 includes a circuit 6b. The circuit 5b and the circuit 6b each include a charge/discharge circuit. The charge/discharge circuit includes an AC/DC conversion circuit, a DC/DC conversion circuit, an inverter circuit, or the like. The charge/discharge circuit of the circuit 5b has a function that converts power on the AC power line 2 into DC power and charges the storage battery 5a, and a function that converts DC power stored in the storage battery 5a into AC power and transmits the power onto the AC power line 2. The charge/discharge circuit of the circuit 5b may have a function that transmits power generated by the generator 5c onto the AC power line 2. The charge/discharge circuit of the circuit 6b has a function that converts power on the AC power line 2 into DC power and charges the storage battery 6a, and a function that converts DC power stored in the storage battery 6a into AC power and transmits the power onto the AC power line 2.

Electric devices 7 and 8 are both electric vehicles. The electric device 7 is, for example, an electric automobile (four-wheeled vehicle) or a hybrid automobile, and the electric device 8 is an electric motorcycle. The electric device 7 includes a storage battery 7a, and the electric device 8 includes a storage battery 8a. The storage batteries 7a and 8a are secondary batteries such as lithium-ion batteries.

The electric device 7 includes a circuit 7b, and the electric device 8 includes a circuit 8b. The circuit 7b and the circuit 8b each include a charge/discharge circuit. The charge/discharge circuit includes an AC/DC conversion circuit, a DC/DC conversion circuit, an inverter circuit, or the like. The charge/discharge circuit of the circuit 7b has a function that converts power on the AC power line 2 into DC power and charges the storage battery 7a, and a function that converts DC power stored in the storage battery 7a into AC power and transmits the power onto the AC power line 2. In the same manner, the charge/discharge circuit of the circuit 8b has a function that converts power on the AC power line 2 into DC power and charges the storage battery 8a, and a function that converts DC power stored in the storage battery 8a into AC power and transmits the power onto the AC power line 2.

Whether to connect the electric devices 5-8 to the connection ports 3 and to charge or discharge the storage batteries 5a-8a may be selectable by users of the devices by switching setting of the electric devices 5-8.

<Management Device>

In the case of the embodiment, the management device 4 is a transportable management device 4 detachably connected to the connection ports 3, but may be a stationary device fixedly installed. The management device 4 being transportable allows the management device 4 to be also used in another power network that includes an AC power line 2 and a plurality of connection ports 3. Driving power of the management device 4 may be supplied from the AC power line 2.

The management device 4 includes a control circuit 40, a measurement circuit 44, and a display device 45. The control circuit 40 includes a processing unit 41, a storage unit 42, and I/F (interface) unit 43. The processing unit 41 is a processor represented by a CPU, and executes a program stored in the storage unit 42. The storage unit 42 is a storage device such as a RAM, a ROM, or a hard disk. The storage unit 42 stores various types of data in addition to the program executed by the processing unit 41. The I/F unit 43 relays transmission and reception of signals between an external device and the processing unit 41.

The measurement circuit 44 includes a current sensor and a voltage sensor, measures an electric signal (AC voltage and AC current here) on the AC power line 2, and outputs measurement results to the control circuit 40. The display device 45 is a device that displays information to a user (for example, an administrator) of the management device 4, and is, for example, an image display device such as a liquid crystal display device.

Figure 2:
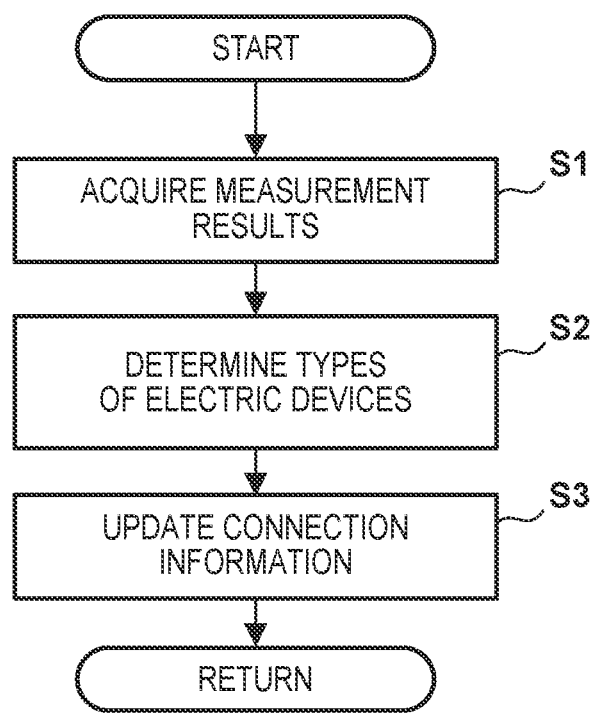
FIG. 2 is a flowchart showing a process example of a management device according to one embodiment of the present invention.

Next, a process example of the management device 4 will be described with reference to FIG. 2 in addition to FIG. 1. FIG. 2 is a flowchart showing a process example executed by the processing unit 41 of the management device 4. In S1, an electric signal on the AC power line 2 is measured with the measurement circuit 44, and its measurement results are acquired. Measurement data may be sequentially stored in the storage unit 42. In S2, types of the electric devices 5-8 connected to the AC power line 2 via the connection ports 3 are determined based on the measurement results of the measurement circuit 44. The types may be models of the electric devices 5-8, or may be types of higher attributes such as a portable generator, a portable battery, an automobile, and a motorcycle.

Regarding a method for determination, for example, when the electric devices 5-8 receive power from the AC power line 2 or transmit power to the AC power line 2, a method can be cited that pays attention to power waveforms or voltage waveforms that appear on the AC power line 2 and are characterized by the types (power storage capacities and characteristics of electric circuits) of the electric devices 5-8. In some cases, it is possible to make a determination by estimating the types of the connected electric devices 5-8 based on their feature quantities.

The feature quantity is, for example, apparent power, power factor, or noise. The power factor is found by dividing effective power by the apparent power, or is found as a cosine ($\cos \theta$) of a phase difference between voltage and current. In the latter case, the measurement circuit 44 measures the phase difference $\theta$. Furthermore, the feature quantity may be a time from start of reception or transmission of power from/to the electric devices 5-8 until a waveform stabilizes, a peak value of current when the reception or transmission of power from/to the electric devices 5-8 is started, or the like.

In the case of the embodiment, since the plurality of electric devices 5-8 may be connected to the AC power line 2, the power waveforms of the respective electric devices are superimposed on a power waveform on the AC power line 2. Therefore, the types of the electric devices may be estimated from the individual feature quantities of the electric devices 5-8 and a feature quantity of each combination in which the plurality of electric devices 5-8 are connected.

In this case, by converting relationships between the types or combinations of the electric devices 5-8 and their feature quantities into data in advance as a feature quantity map 42a and comparing the feature quantity map 42a with a feature quantity measured with the measurement circuit 44, the types of the electric devices 5-8 and power reception or power transmission (that is, charging or discharging of the storage batteries 5a-8a) can be estimated. The types of the electric devices 5-8 and power reception or power transmission can be determined by applying or using a known apparatus separation technique as well.

In S3, connection information 42b is updated based on determination results in S2. The connection information 42b is stored in the storage unit 42. In the illustrated example, "type" stores determination results of the electric devices 5-8. "Charging/discharging" stores either power reception (charging) or power transmission (discharging). "Time zone" stores a connection time zone (for example, 9:00-13:00) during which the electric devices 5-8 were connected to the connection ports 3 and were receiving or transmitting power. Contents of the connection information 42b can be displayed on the display device 45 and notified to the administrator. This ends one round of the processes.

The following are examples of utilizing the connection information 42b. First, it makes possible to identify a relationship of power transfer between power devices. For example, as shown by arrows in the example of FIG. 1, a state is assumed in which the electric device 6 is charged and the electric devices 5, 7, and 8 are discharged. By referring to the connection information 42b, the source of power to the electric device 6 can be identified as the electric devices 5, 7, and 8. It makes possible to identify or narrow down users by associating the determination results of the types of the electric devices 5, 7, and 8 with the users. This will be useful information, for example, when giving some incentive to the users of the electric devices 5, 7, and 8 who are providers of power, while charging price for the user of the electric device 6 who is a consumer of power.

Next, as a result of the types of the electric devices 5-8 being determined, capacities of the storage batteries 5a-8a are estimated. Although power storage capacities of the electric vehicle, the portable generator, or the portable battery vary, they fall within a certain range, and thus it is possible to treat each power storage amount of those as a general representative value. As an example of a general magnitude relationship, it can be mentioned that the storage battery 7a (four-wheeled vehicle)>the storage battery 8a (motorcycle)>the storage battery 6a (portable battery)>the storage battery 5a (portable generator).

It is possible to adjust the balance of supply and demand since the capacities of the storage batteries 5a-8a are estimated. For example, in the state in which the electric device 6 is charged and the electric devices 5, 7, and 8 are discharged as illustrated in FIG. 1, it can be expected that an amount of power to be supplied to the electric device 6 is sufficiently covered. Conversely, in a state in which the electric device 7 is charged and only the electric device 5 is discharged, an amount of power supplied to the electric device 7 is likely to be insufficient. In this case, the administrator can take measures such as transmitting power to the AC power line 2 by some method.

As another utilization example, the representative values of the power storage amounts corresponding to the types of the electric devices 5-8 can be used as a guide for estimating scales of energy resources connected to the AC power line 2. Furthermore, discriminating between power reception (charging) and power transmission (discharging) allows for supply and demand prediction of the energy resources connected to the AC power line 2. For example, when all of the connected electric devices are used for charging, it can be predicted that a power supply (amount of discharging) of about 60% of the power storage amount of each electric device will occur thereafter. Conversely, when all of the connected electric devices are used for discharging, it can be predicted that a power demand (amount of charging) of about 60% of the power storage amount of each electric device will occur thereafter.

As described above, in the embodiment, it is possible to monitor what kinds of the electric devices 5-8 are connected to the AC power line 2 and to use its determination results for various purposes. Since the management device 4 is attachable to and detachable from the connection ports 3, and the connection ports 3 have a simple configuration, construction of the management system 1 is relatively easy. In particular, since the connection ports 3 do not have a function of determining the types of the electric devices 5-8, complication of the connection ports 3 can be avoided and their installation can be made simple.

Second Embodiment

Figure 3:
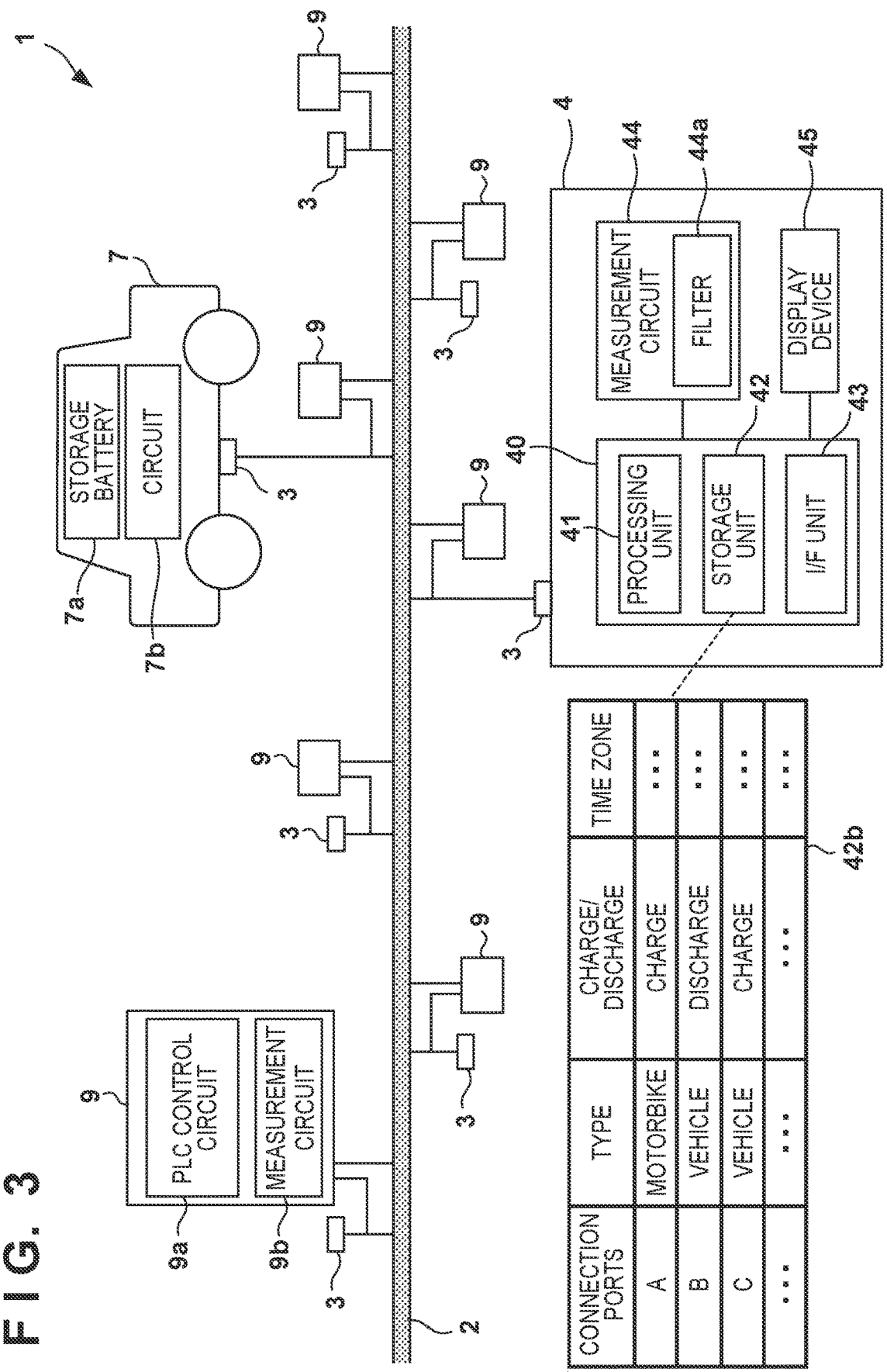
FIG. 3 is a schematic diagram of another management system.

In the first embodiment, it is not possible to identify which electric devices 5-8 are connected to which connection ports 3. In a second embodiment, a configuration example that enables it will be described. FIG. 3 is a schematic diagram of a management system 1 in the embodiment. Differences from the first embodiment will be described.

In the case of this embodiment, each connection port 3 is provided with a PLC (Power Line Communication) unit 9. The PLC unit 9 includes a PLC control circuit 9a and a measurement circuit 9b. The measurement circuit 9b measures AC current flowing through the connection port 3 and AC voltage. The PLC control circuit 9a determines whether any of the electric devices 5-8 is connected to the connection port 3 based on measurement results of the measurement circuit 9b. When the PLC control circuit 9a determines that one of the electric devices 5-8 is connected, it superimposes an identification signal of the connection port 3 on an AC power signal on an AC power line 2. The superimposed identification signal is, for example, a high frequency signal having a frequency of several tens of MHz. The identification signal may be transmitted when it is determined that any of the electric devices 5-8 is connected to the connection port 3 and when it is determined that connection is released. In addition, it may be periodically transmitted during connection.

A measurement circuit 44 of a management device 4 includes a filter 44a that separates the AC power signal on the AC power line 2 into a power signal and the identification signal. The power signal separated by the filter 44a is used to determine the type of electric device and the identification signal is used to identify the connection port 3. In the case of the embodiment, information on the connection port 3 ("connection port") identified from the identification signal is added to connection information 42b. In the case of the example of the figure, it is indicated that a motor cycle is connected to a connection port "A."

Figure 4:
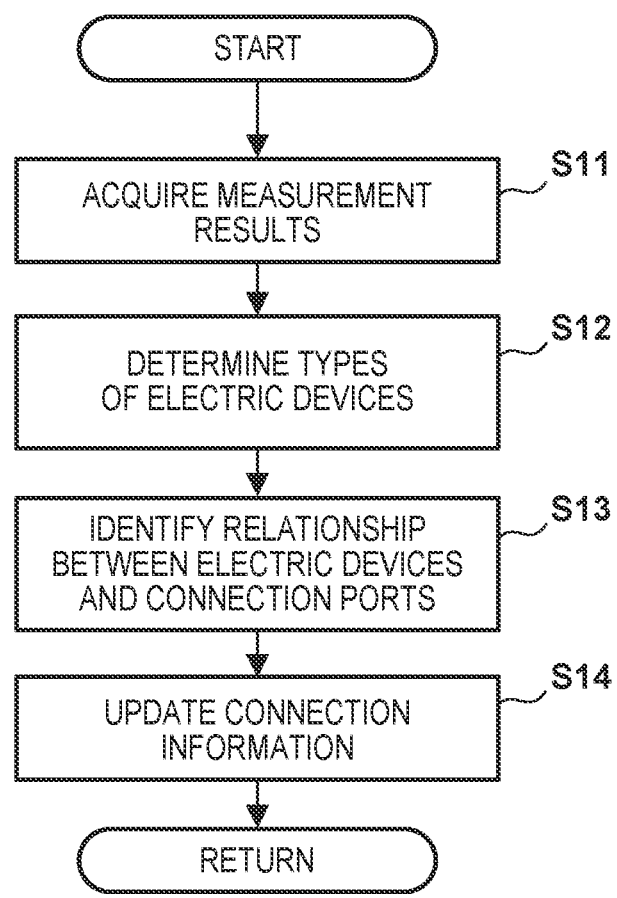
FIG. 4 is a flowchart showing a process example of a management device in the embodiment of FIG. 3.

FIG. 4 is a flowchart showing a process example executed by a processing unit 41 of the management device 4 in the embodiment. Processes of S11 and S12 are processes similar to those of S1 and S2 shown in FIG. 2. That is, in S11, an electric signal on the AC power line 2 is measured with the measurement circuit 44, and its measurement results are acquired. In S12, types of the electric devices 5-8 connected to the AC power line 2 via the connection ports 3 are determined based on the measurement results (power signal) of the measurement circuit 44. In S13, the connection ports 3 to which the electric devices of the types determined in S12 are connected are identified based on the measurement results (identification signal) of the measurement circuit 44. As an example of the identification, for example, when connection of a new electric device is confirmed as a result of determination of the type in S12 within a predetermined time before and after reception of the identification signal, the electric device can be identified as being connected to the connection port 3 identified by the identification signal. In S14, the connection information 42b is updated based on results in S12 and S13. This ends one round of the processes.

According to the embodiment, since the connection relationship between the connection ports 3 and the electric devices 5-8 can be identified, it becomes easy to identify, for example, users of the connected electric devices 5-8. In addition, it becomes easy to take actions such as changing charging/discharging setting of the connected electric devices 5-8 when adjusting the balance of supply and demand.

The measurement circuit 9b may have a function of measuring an amount of power flowing through the connection port 3. Information on the measured amount of power may be included in the identification signal. This allows the management device 4 to identify the charge and discharge amounts of the electric devices 5-8.

Third Embodiment

Figure 5:
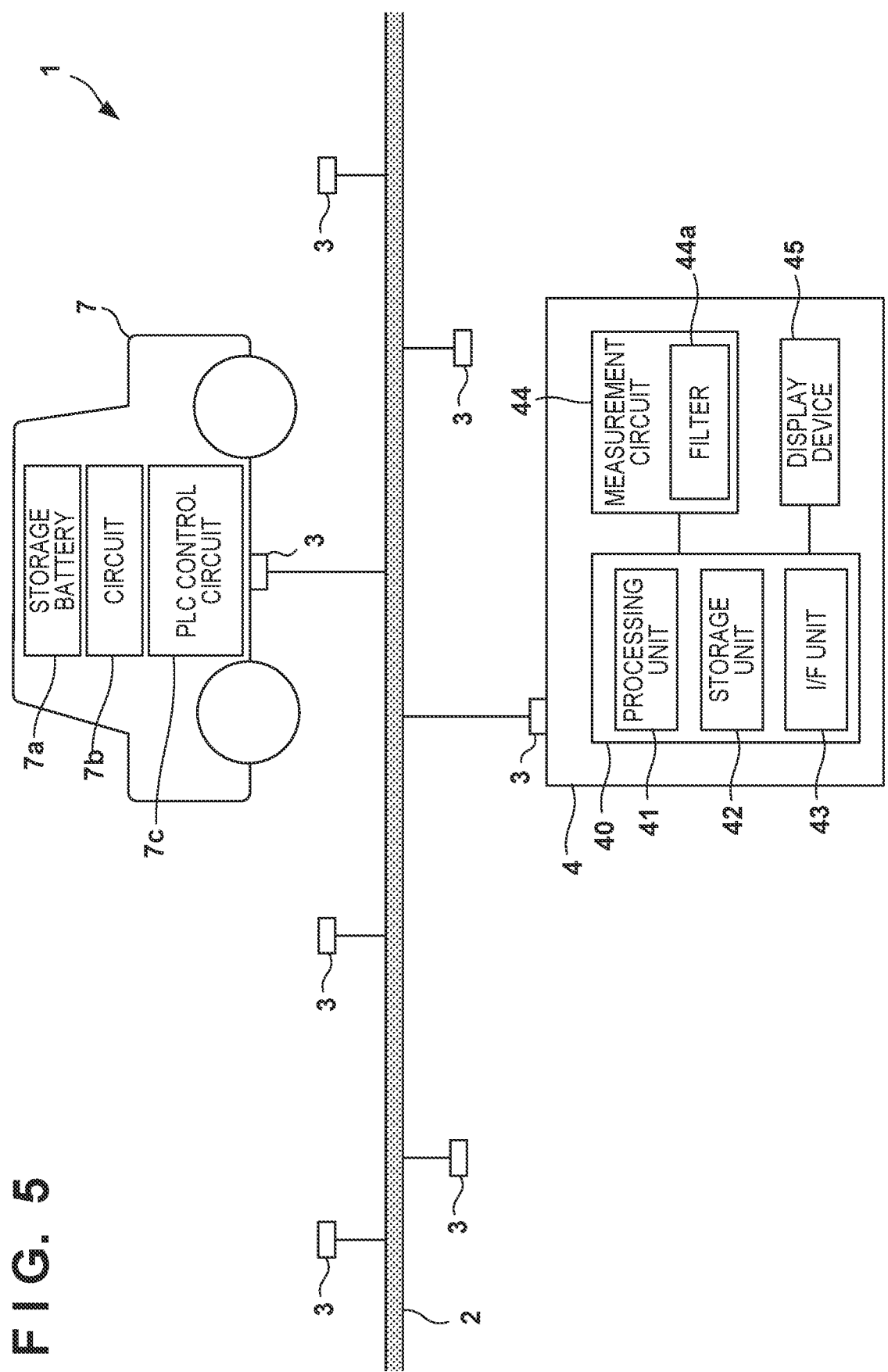
FIG. 5 is a schematic diagram of another management system.

In the second embodiment, the connection port 3 is provided with the PLC unit 9, but the electric devices 5-8 may include PLC control circuits. FIG. 5 is a schematic diagram of a management system 1, showing an example of that. An electric device 7, which is an electric automobile or a hybrid automobile in the example of the figure, includes a PLC control circuit 7c. The PLC control circuit 7c superimposes an identification signal indicating a type of the electric device 7 and charging or discharging on an AC power signal on an AC power line 2.

A management device 4 determines the type of the electric device 7 and charging or discharging from an identification signal separated by a filter 44a. This embodiment is the same as the first and second embodiments in that the type of electric device is determined based on the electric signal on the AC power line 2, but it is not necessary to determine the type of electric device from the power signal as in the first and second embodiments. It is because the type of electric device can be determined from the identification signal.

Fourth Embodiment

Figure 6:
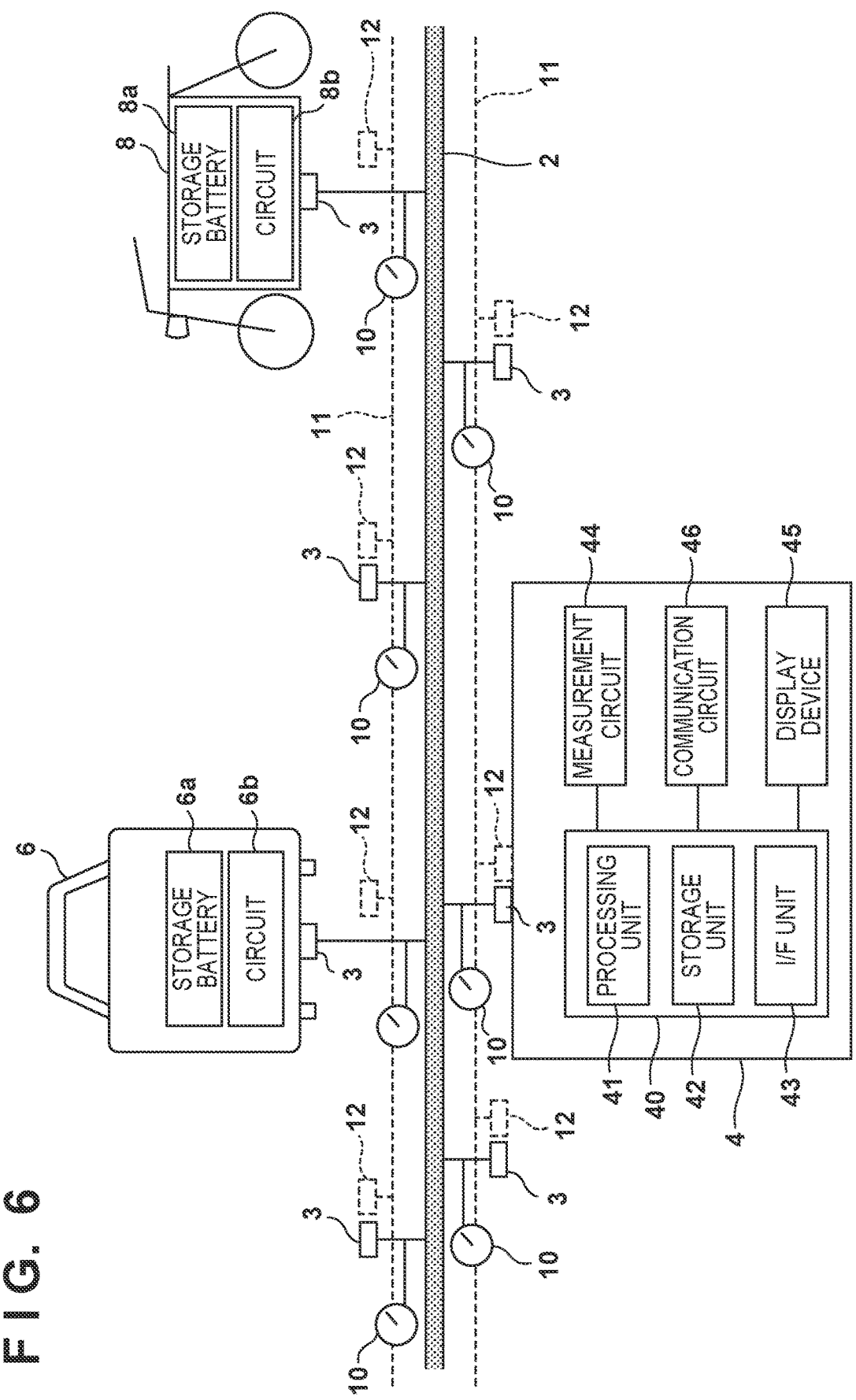
FIG. 6 is a schematic diagram of another management system.

This embodiment describes an example in which a management device 4 acquires information on an amount of power flowing through each connection port 3 using a communication network. FIG. 6 is a schematic diagram of a management system 1 of the embodiment. In the case of the embodiment, each connection port 3 is provided with a smart meter 10. The smart meter 10 includes a measurement circuit that measures an amount of power flowing through the connection port 3, and also includes a communication circuit that transmits an identification signal including a measurement result to the management device 4 via a LAN 11. The smart meter 10 has a unique identifier set thereto, and the identification signal includes information on the identifier and the measurement result. With this, it is possible to identify it as the amount of power (charge/discharge amount) of the electric device 5-8 connected to which connection port 3.

The management device 4 includes a communication circuit 46 that receives the identification signal from the smart meter 10 via the LAN 11. The LAN 11 is provided with a connection port 12 for each connection port 3. In the embodiment also, the management device 4 can be detachably attached to the connection port 3, at the time of connection, the management device 4 is also connected to the connection port 12, and thereby the communication circuit 46 is able to communicate with the smart meter 10 via the LAN 11. Wired communication is illustrated here, but wireless communication may be used.

With such a configuration, the management device 4 determines the types of the electric devices 5-8 connected to the connection ports 3 from the electric signal (power signal) on the AC power line 2, and identifies connection ports 3 connected to the electric devices and amounts of power from the identification signals transmitted from the smart meters 10. As an example of the identification, for example, when connection of a new electric device is confirmed as a result of determination of the type of electric device within a predetermined time before and after reception of the identification signal, the electric device can be identified as being connected to the connection port 3 identified by the identification signal. According to the embodiment, connection information 42b can further store information on the charge/discharge amount in the example of FIG. 3.

Fifth Embodiment

Figure 7:
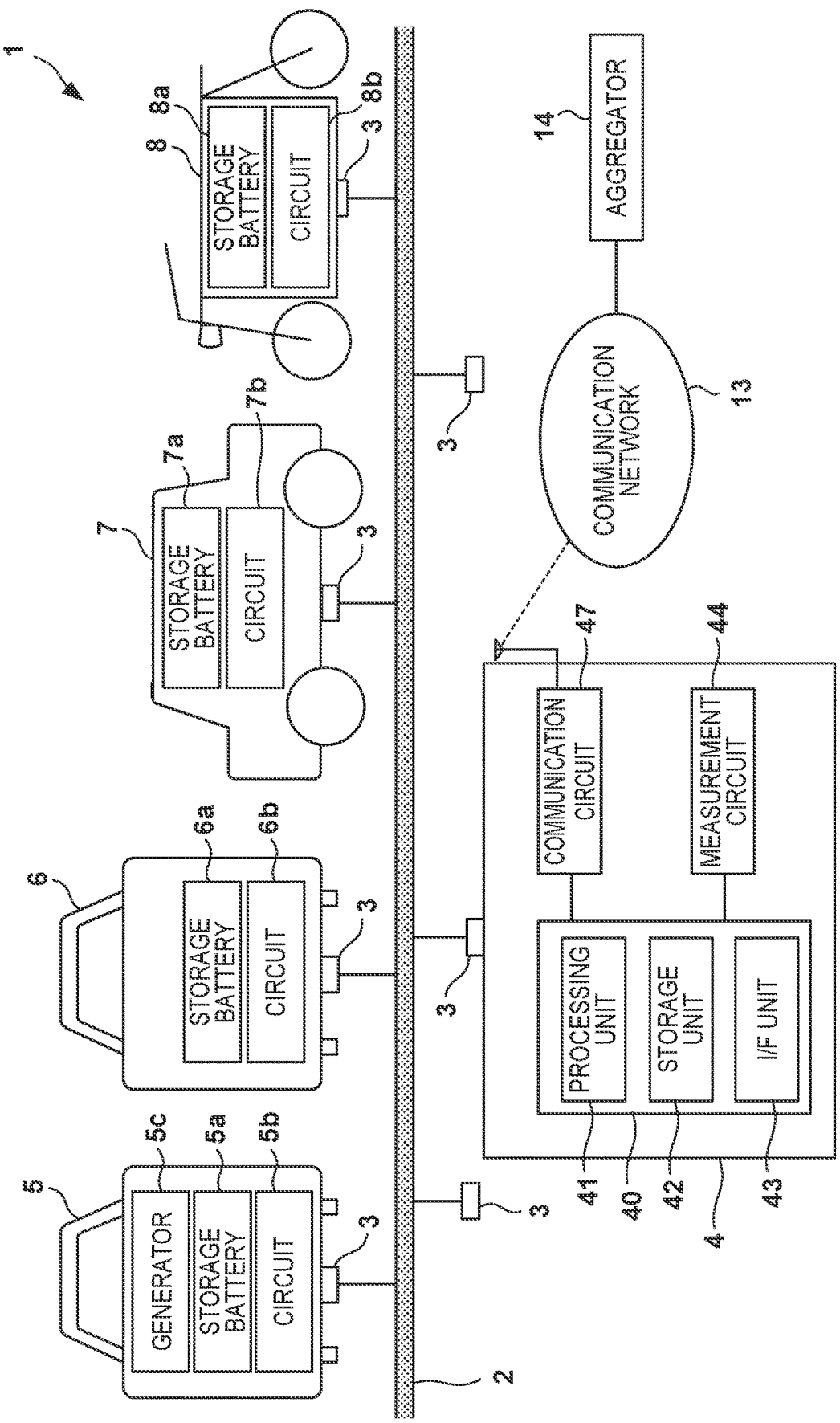
FIG. 7 is a schematic diagram of another management system.

Information generated by a management device 4 may be provided for an aggregator of a VPP (Virtual Power Plant). FIG. 7 is a schematic diagram of a management system 1 of this embodiment. A configuration different from the configuration example of FIG. 1 will be described. The management device 4 of the embodiment includes a communication circuit 47. The communication circuit 47 is a wireless communication device that performs information communication with an aggregator 14 via a communication network 13 such as the Internet. The aggregator 14 is, for example, a server computer.

FIG. 8 is a flowchart showing a process example executed by a processing unit 41 of the management device 4 in the embodiment. Processes of S21-S23 are processes similar to those of S1-S3 shown in FIG. 2. That is, in S21, an electric signal on an AC power line 2 is measured with a measurement circuit 44, and its measurement results are acquired, and in S22, types of electric devices 5-8 connected to the AC power line 2 via the connection ports 3 are determined based on the measurement results (power signal) of the measurement circuit 44. In S23, connection information 42b is updated based on results in S22.

In S24, it is determined whether prediction timing has arrived. When the prediction timing has arrived, the process proceeds to S25, whereas when the prediction timing has not arrived, one round of the processes ends. The prediction timing can be a periodic timing like, for example, every 30 minutes. The prediction timing may also be, for example, specific time (such as 9:00, 11:00, 13:00, 15:00, or 17:00).

In S25, amounts of power supply and demand in the management system 1 is predicted. A method for prediction is as described in the first embodiment. That is, scales of energy resources connected to the AC power line 2 are estimated using representative values of the power storage amounts corresponding to the types of the electric devices 5-8 as a guide. At that time, distinguishing whether states of the electric devices 5-8 are charging or discharging allows for prediction of an amount of power demand (charge amount) or an amount of power supply (discharge amount). A range of prediction may be amounts of supply and demand within a predetermined time thereafter. For example, it may be amounts of supply and demand within several hours thereafter, or amounts of supply and demand within a half day. An object of prediction may be only one of the amount of power demand or the amount of power supply.

In S26, the communication circuit 47 transmits prediction results in S25 to the aggregator 14. This ends one round of the processes. The aggregator 14 can use the received prediction results for power operation thereafter.

Other Embodiment

The first embodiment to the fifth embodiment can be appropriately combined.

Summary of the Embodiments

1. A management device (for example, 4) of the embodiment is a management device connected to an AC power line (for example, 2) provided with a plurality of connection ports (for example, 3), each of which can be connected to an electric device (for example, 5-8) including a power storage unit (for example, 5a-8a), and comprises:

a measurement unit (for example, 44) configured to measure an electric signal on the AC power line; and a determination unit (for example, 41) configured to determine a type of the electric device connected to the AC power line via a connection port in the plurality of connection ports based on a measurement result of the measurement unit.

According to the embodiment, it is possible to provide a technique capable of monitoring what kind of the electric device is connected to the AC power line.

2. The management device (for example, 4) of the embodiment comprises a prediction unit (for example, 41 and S25) configured to predict an amount of power demand on the AC power line based on the determination result of the determination unit.

According to the embodiment, it is possible to utilize the predicted amount of power demand in a VPP or the like.

3. The management device (for example, 4) of the embodiment comprises a prediction unit (for example, 41 and S25) configured to predict an amount of power supply on the AC power line based on a determination result of the determination unit.

According to the embodiment, it is possible to utilize the predicted amount of power supply in a VPP or the like.

4. The management device (for example, 4) of the embodiment further comprises an identification unit (for example, 41 and S13) configured to identify a correspondence relationship between the electric device whose type is determined by the determination unit and the connection port connected to the electric device based on an identification signal that is transmitted from a signal transmission unit (for example, 9 or 10) provided in each of the connection ports and identifies the connection port.

According to the embodiment, since the connection relationship between the connection port and the electric device can be identified, it becomes easy to identify, for example, a user of the connected electric device. In addition, when the balance of supply and demand is adjusted, it becomes easy to take measures such as changing the charging/discharging setting of the connected electric device.

5. In the embodiment, the management device is attachable to and detachable from a connection port in the plurality of connection ports.

According to the embodiment, since the management device is transportable, it is also possible to use the management device in another power network including the AC power line and a plurality of the connection ports.

6. In the embodiment, the determination unit can determine an electric vehicle (for example, 7 or 8) as a type of the electric device.

According to the embodiment, it is possible to determine the electric vehicle as a charge destination or a supply source of power.

7. In the embodiment, the determination unit estimates a type of the electric device based on at least one of AC voltage or AC current on the AC power line.

According to the embodiment, it is possible to reduce configurations necessary to determine the type of the electric device.

8. A method of the embodiment comprises:

a measurement step (for example, S, S11, or S21) of measuring an electric signal on an AC power line (for example, 2) including a plurality of connection ports (for example, 3) to which an electric device (for example, 5-8) including a power storage unit (for example, 5a-8a) can be connected; and a determination step (for example, S2, S12, or S22) of determining a type of the electric device connected to the AC power line via one of the connection ports based on a measurement result in the measurement step.

According to the embodiment, it is possible to provide the technique capable of monitoring what kind of the electric device is connected to the AC power line.

The present invention is not limited to the above embodiments and various changes and modifications can be made within the spirit and scope of the present invention. Therefore, to apprise the public of the scope of the present invention, the following claims are made.

What is claimed is:

1. A management device connected to an AC power line provided with a plurality of connection ports, each of which can be connected to a n electric device including a power storage device, the management device comprising at least one processor circuit with a memory comprising instructions, that when executed by the processor circuit, cause the at least one processor circuit to at least:

measure an electric signal on the AC power line;

determine a type of the electric device connected to the AC power line via a connection port in the plurality of connection ports and whether the power storage device is charged or discharged based on a measurement result;

predict an amount of power supply on the AC power line due to discharge of the power storage device based on a determination result of the type of the electric device;

estimate a capacity of the power storage unit based on the type of the electric device; and predict the amount of power supply by electric devices connected to the AC power line via the connection ports based on the capacity of the power storage device of each of the electric devices and whether the power storage device of each of the electric devices is charged or discharged, and wherein the AC power line comprises a closed power network which is disconnected from a power system by a circuit.

2. The management device according to claim 1, wherein, when executed, the instructions further cause the processor circuit to at least predict an amount of power demand on the AC power line based on the determination result.

3. The management device according to claim 1, wherein, when executed, the instructions further cause the processor circuit to at least transmit a prediction result associated with the amount of power supply on the AC line to an aggregator via a communication network which is separated from the AC power line.

4. The management device according to claim 1, wherein, when executed, the instructions further cause the processor circuit to at least identify a correspondence relationship between the electric device whose type is determined and the connection port connected to the electric device based on an identification signal that is transmitted from each of the connection ports and identifies the connection port.

5. The management device according to claim 1, wherein the management device is attachable to and detachable from a connection port in the plurality of connection ports.

6. The management device according to claim 1, wherein the type of the electric device can comprise an electric vehicle.

7. The management device according to claim 1, wherein the type of the electric device is estimated based on at least one of AC voltage or AC current on the AC power line.

8. A method comprising:
a measurement step of measuring an electric signal on an AC power line including a plurality of connection ports to which an electric device including a battery can be connected;
a determination step of determining a type of the electric device connected to the AC power line via one of the connection ports and whether the battery is charged or discharged based on a measurement result in the measurement step; and
a prediction step of predicting an amount of power supply on the AC power line due to discharge of the battery based on a determination result in the determination step,
wherein in the prediction step:
a capacity of the battery is estimated based on the type of the electric device determined in the determination step; and
the amount of power supply by electric devices connected to the AC power line via the connection ports is predicted based on the capacity of the battery of each of the electric devices and whether the battery of each of the electric devices is charged or discharged, and
wherein the AC power line comprises a closed power network which is disconnected from a power system by a circuit.

9. A management device connected to an AC power line provided with a plurality of connection ports, each of which can be connected to a n electric device including a battery, the management device comprising:
a sensor configured to measure an electric signal on the AC power line; and
a processing circuit including at least one processor and at least one storage device and configured to:
determine a type of the electric device connected to the AC power line via a connection port in the plurality of connection ports and whether the battery is charged or discharged based on a measurement result of the sensor; and
predict an amount of power supply on the AC power line due to discharge of the battery based on a determination result of the type of the electric device,
wherein the processing circuit is configured to:
estimate a capacity of the battery based on the type of the electric device in the determination result; and
predict the amount of power supply by electric devices connected to the AC power line via the connection ports based on the capacity of the battery of each of the electric devices and whether the battery of each of the electric devices is charged or discharged, and
wherein the AC power line comprises a closed power network which is disconnected from a power system by a circuit.

10. The management device according to claim 1, wherein, when executed, the instructions further cause the processor circuit to at least update information indicating the determination result.

11. The management device according to claim 9, wherein the processing circuit is configured to update information indicating the determination result of the type of the electric device.

* * * * *